United States Patent
Hartmann et al.

(10) Patent No.: US 8,974,585 B2
(45) Date of Patent: Mar. 10, 2015

(54) FAN-AND-FILTER UNIT

(75) Inventors: Reiner Hartmann, Wettenberg (DE); Bernd Lehnert, Lahnau (DE); Stefan Schneider, Bad Endbach (DE)

(73) Assignee: Rittal GmbH & Co. KG, Herborn (DE)

( * ) Notice: Subject to any disclaimer, the term of this patent is extended or adjusted under 35 U.S.C. 154(b) by 136 days.

(21) Appl. No.: 13/261,481

(22) PCT Filed: Mar. 15, 2011

(86) PCT No.: PCT/EP2011/053837
§ 371 (c)(1),
(2), (4) Date: Oct. 17, 2012

(87) PCT Pub. No.: WO2011/131421
PCT Pub. Date: Oct. 27, 2011

(65) Prior Publication Data
US 2013/0068106 A1    Mar. 21, 2013

(30) Foreign Application Priority Data
Apr. 19, 2010    (DE) .......................... 10 2010 016 519

(51) Int. Cl.
| B01D 46/46 | (2006.01) |
| B01D 46/00 | (2006.01) |
| B01D 46/10 | (2006.01) |
| B01D 46/42 | (2006.01) |
| B01D 46/44 | (2006.01) |
(Continued)

(52) U.S. Cl.
CPC ............ *B01D 46/0086* (2013.01); *B01D 46/10* (2013.01); *B01D 46/4254* (2013.01); *B01D 46/44* (2013.01); *H05K 7/20181* (2013.01); *B01D 2273/30* (2013.01); *F24F 2011/0093* (2013.01)

USPC .................. 96/417; 96/420; 96/421; 96/424; 55/471

(58) Field of Classification Search
USPC ....... 55/471, DIG. 34, 467; 96/413, 416, 417, 96/423, 424; 95/19, 23, 1; 116/DIG. 25, 116/271; 73/24.01, 570
See application file for complete search history.

(56) References Cited

U.S. PATENT DOCUMENTS

| 5,917,141 A | 6/1999 | Naquiin, Jr. |
| 5,955,955 A | 9/1999 | Corcoran, Jr. et al. |
(Continued)

FOREIGN PATENT DOCUMENTS

| DE | 93 06 032 U1 | 12/1993 |
| DE | 44 07 969 A1 | 9/1994 |
(Continued)

*Primary Examiner* — Duane Smith
*Assistant Examiner* — Minh-Chau Pham
(74) *Attorney, Agent, or Firm* — Marshall & Melhorn, LLC

(57) ABSTRACT

The invention relates to a fan-and-filter unit to be mounted in the wall of a switch cabinet or housing, and includes a fan unit inserted in a fan housing, a filter mat arrangement mounted upstream of the fan unit and a fan cover immobilizing the filter mat. An embodiment advantageous for operation of the fan-and-filter unit may be provided where the fan-and-filter unit has a filter mat monitoring unit which is designed to detect the service life and/or a degree of soiling of the filter mat arrangement and which includes an insert integrated into the fan housing or the fan cover and having an illuminated display visible from the exterior of the fan cover facing away from the fan unit and being designed to display at least exceeding of a predetermined or predeterminable service life and/or a predetermined or predeterminable degree of soiling.

8 Claims, 4 Drawing Sheets

(51) Int. Cl.
*H05K 7/20* (2006.01)
*F24F 11/00* (2006.01)

(56) References Cited

U.S. PATENT DOCUMENTS

| | | | | |
|---|---|---|---|---|
| 6,228,155 B1 * | 5/2001 | Tai | ...................... | 96/413 |
| 6,315,821 B1 * | 11/2001 | Pillion et al. | ............. | 96/416 |
| 6,494,940 B1 * | 12/2002 | Hak | ...................... | 96/224 |
| 6,508,868 B2 * | 1/2003 | Pillion et al. | ............. | 96/416 |
| 6,912,968 B2 * | 7/2005 | Carbajal | ............. | 116/308 |
| 7,594,960 B2 * | 9/2009 | Johansson | ............. | 96/417 |
| 7,686,872 B2 * | 3/2010 | Kang | ............. | 96/417 |
| 8,083,841 B2 * | 12/2011 | Cheng | ............. | 96/417 |
| 8,097,067 B2 * | 1/2012 | Fox et al. | ............. | 95/25 |
| 2008/0121107 A1 | 5/2008 | Pfannenberg | | |

FOREIGN PATENT DOCUMENTS

| | | |
|---|---|---|
| DE | 197 14 838 A1 | 10/1998 |
| DE | 10 2004 013 318 B4 | 3/2006 |
| DE | 198 60 433 B4 | 3/2006 |
| DE | 202006015789 U1 | 7/2006 |
| DE | 20 2006 015 789 U1 | 12/2006 |
| DE | 20 2008 006 067 U1 | 7/2008 |
| EP | 1 911 504 A2 | 4/2008 |
| WO | WO 02/063936 A2 | 8/2002 |

* cited by examiner

FAN-AND-FILTER UNIT

BACKGROUND OF THE INVENTION

The invention relates to a fan-and-filter unit to be mounted in the wall of a switch cabinet or housing, comprising a fan unit inserted in a fan housing, a filter mat arrangement mounted upstream of the fan unit and a fan cover immobilizing the filter mat.

A fan-and-filter unit of this type to be mounted in an opening of a wall of a switch cabinet or a housing is described in DE 198 60 433 B4. The fan-and-filter unit comprises a fan housing in which a fan unit with electromotor and fan wheel for suction of air from the exterior into the interior of the cabinet or for expelling air from the interior of the cabinet is arranged and which is covered towards the outer side by a louvre grid having horizontal lamellae and air outlet openings therebetween. A filter mat is inserted between fan cover and fan unit which in turn is retained at the fan cover by means of a supporting grid. The filter mat retains dirt particles present in the flow path and may become clogged more or less quickly, according to the field of use of the switch cabinet or housing, respectively, and depending on its construction, so that fan efficiency and filtering effect of the fan-and-filter unit may be restricted considerably over time. Thus, it is important to replace the filter mat every once in a while. This is easily forgotten by a user.

Another fan-and-filter unit of this type is shown in DE 93 06 032 U1, wherein also a cross-section of a filter housing may be recognized, which possesses an approximately funnel-shaped construction, so that even in a relatively small fan unit a relatively large air inlet or air outlet opening, respectively, results, which is located in the region of the wall of the switch cabinet or housing and is covered by the filter mat.

Another fan-and-filter unit is shown in DE 10 2004 013 318 B4, that fan-and-filter unit, however, being installed within a larger housing having air inlet and air outlet openings, and a specific flow channel is formed to avoid condensation problems. A filter housing and a fan housing are arranged vertically neighboured with respect to the vertical cabinet wall within the larger housing unit to form a vertical air duct.

A switch cabinet air-conditioning device is shown in DE 197 14 838 C2 comprising, inter alia, an air-conditioning unit in form of a fan as well as a filter mat monitoring means which is part of a superordinate switchgear cabinet monitoring and controlling device in which error data and diagnostic data including switched-on periods may be stored and which may be connected to a personal computer serving as an operating means via an interface. A filter mat monitoring unit of this type is relatively complex and mainly suitable for service staff.

SUMMARY OF THE INVENTION

The invention is based on the object to provide a fan-and-filter unit of the type mentioned in the introductory which offers simplified maintenance also for the user.

This object is solved by the features of claim 1. Hereby it is provided that the fan-and-filter unit has a filter mat monitoring unit which is designed to detect the service life and/or a degree of soiling of the filter mat arrangement and which comprises an insert integrated into the fan housing or the fan cover and having an illuminated display visible from the exterior of the fan cover facing away from the fan unit, and designed to display exceeding of a predetermined or predeterminable service life and/or a predetermined or predeterminable degree of soiling.

By this configuration, the fan-and-filter unit itself is provided with a filter mat monitoring unit which may be easily controlled by a user or operating staff and which, due to its compact construction, is installed almost not influencing anything and offers a well-recognizable display of state to the user and to operating personnel.

For functioning of the filter mat monitoring unit, it is advantageously provided that the filter mat monitoring unit comprises a timer unit for determining the service life of the filter mat arrangement and/or a soiling sensor means having at least one sensor element for determining the degree of soiling of the filter mat arrangement as well as a monitoring electronic to analyze signals output by the timer means and/or the soiling sensor means and to produce at least one drive signal for the illuminated display. For a combination of timer means and soiling sensor means, an increased reliability of the filter mat diagnostics may be achieved, and the illuminated display may be driven either based on a signal output by the soiling sensor means or the timer means or on the basis of a signal based on a previous calculation of the signals output by the soiling sensor means and the timer means. In this way, the illuminated display may be driven with a control signal for replacement of the filter mat and produce a corresponding warning indication after expiration of a maintenance period and/or when exceeding a predetermined degree of soiling.

An embodiment advantageously adjusted or adjustable to different applications of a switch cabinet or a housing consists in that input means are provided so that different set values for operating conditions of the switch cabinet or housing or directly service lifes or degrees of soiling for exchanging the filter mat arrangement may be input. When inputting said values for operating conditions of the switch cabinet or housing, the filter mat monitoring unit determines in a monitoring electronics an appropriate operation period or a threshold for a degree of soiling, wherein e.g. in a dust or humidity loaded environment a shorter operation period until filter exchange is predefined.

If it is provided that the illuminated display includes a light emitting diode arrangement to emit light of at least two different colours, an indication of a forthcoming filter exchange may be given to the user or service staff, respectively, already before expiration of a maintenance interval or before reaching an inadmissible degree of soiling. For example, a three-step colour display is advantageous, with green indicating a proper filter mat condition, yellow indicating a forthcoming filter mat exchange and red indicating a required filter mat exchange, wherein a particularly urgent filter mat condition may additionally be signalled by a flashing display.

By the feature that the timer means comprises an operating timekeeper for fan operation, the maintenance interval may be adjusted to the actual operating time of the fan unit (aggregated switch-on states of the fan motor), or the operating time of the fan may be considered for weighting (reduction or extension) the maintenance interval. Also here a compensation with the signal of the soiling sensor means or a parallel analysis thereof for producing the drive signal for the illuminated display is possible.

Those features contribute to a compact simple construction so that all components of the filter mat monitoring unit except at least one sensor element and/or an external electric power supply are received by the insert.

An advantageous embodiment consist in particular in that all components of the filter mat monitoring unit including their electric power supply are received by the insert. If the insert is integrated into the fan cover, it can be completely removed from the fan housing, when exchanging filter mats, in an easy way. Energy consumption which is as low as possible is supported in combination with the light emitting diode arrangement as an illuminated display, wherein a small unit for electric power supply is sufficient.

Another advantageous embodiment consists in that the timer means and/or the soiling sensor means comprises a detector means for detecting the operating time and/or the operating conditions of the fan unit which is coupled to the fan unit through a wired or wireless connection for signal detection and which supplies detection signals to the timer means, the operating time and/or the operating state of the fan unit since the last filter exchange being determined on the basis of those detection signals. On the basis of the signals from the detector means, operating time or operating states (e.g. high load or low load), respectively, of the fan unit may be included when producing the drive signal for the illuminated display, e.g. to include the determined operating times of the fan and/or e.g. to draw conclusions with respect to the degree of soiling from load variations of the fan motor for increasing filter mat soiling.

Advantageous configuration variants consist in that the soiling sensor means includes a flow sensor, a pressure sensor, a temperature sensor, an optical sensor, an electric field sensor, a magnetic field sensor or an electric conductivity sensor or a combination of at least two such sensors, wherein the sensors comprise one or more sensor elements. An optical sensor may be embodied e.g. with light emitter and light receiver as a sensor measuring reflected light or as a transmission sensor, an electric field sensor as a capacitive sensor, an electric conductivity sensor or resistivity sensor, respectively, as a current or voltage measuring sensor having e.g. two spaced electrodes in contact with the filter mat, in particular when conductive ingredients are contained in the filter mat, such as, e.g., in an arrangement for electromagnetic shielding, or resistance variations result in a humid environment.

An embodiment advantageous for construction consists in that the insert comprises at least one receiving chamber for an electric power supply unit, for the timer means, for the monitoring electronics and/or for at least one sensor element.

Further advantageous provisions consist in that the insert is attached to the fan cover from inside or outside, in particular detachably snapped in or screwed thereto or adhered thereto.

Advantage for construction further result by forming a recess adapted to the insert in the fan cover.

For function and operation further those provisions are advantageous that the recess is arranged in the region of a grid structure with air outlet openings of the fan cover. For example, the insert may advantageously be combined with a manufacturer's logo formed as an insert and may simultaneously be used as an outer surface of a cover side of the insert for applying the logo.

BRIEF DESCRIPTION OF THE DRAWINGS

The invention will be explained in detail below with the aid of exemplary embodiments with reference to the drawings.

DETAILED DESCRIPTION OF THE INVENTION

Figure 1:
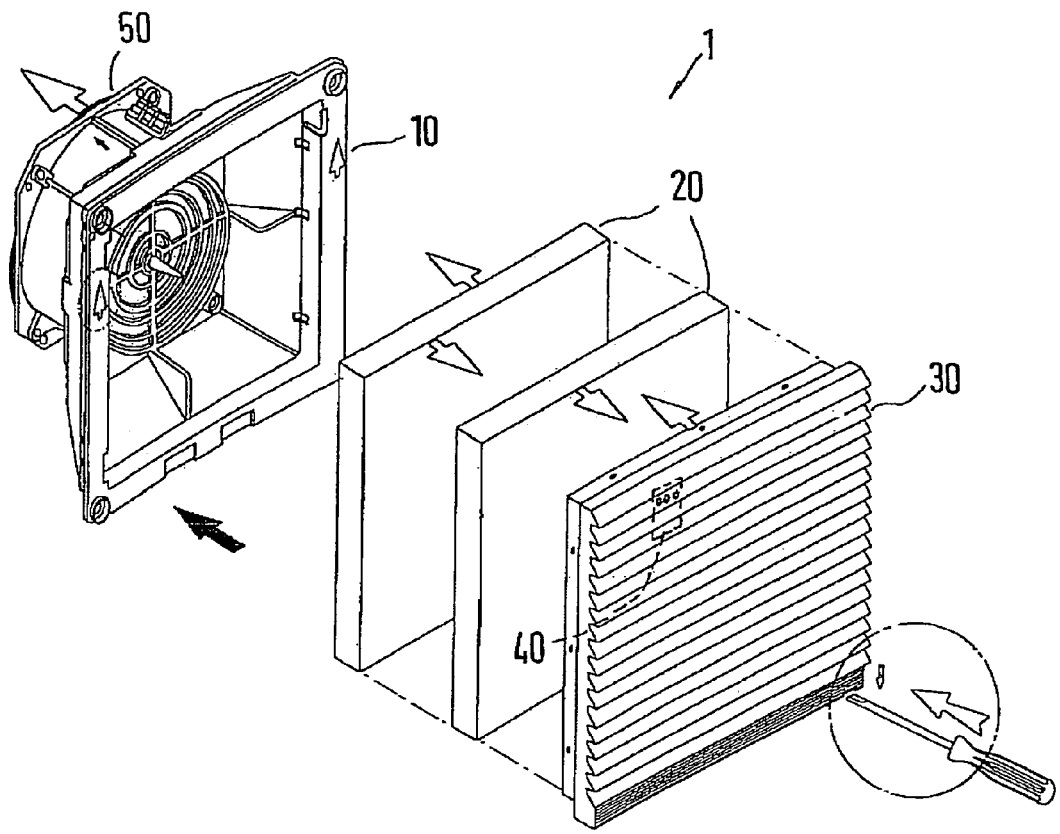
FIG. 1 shows a perspective illustration of an exploded fan-and-filter unit.
Figure 2:
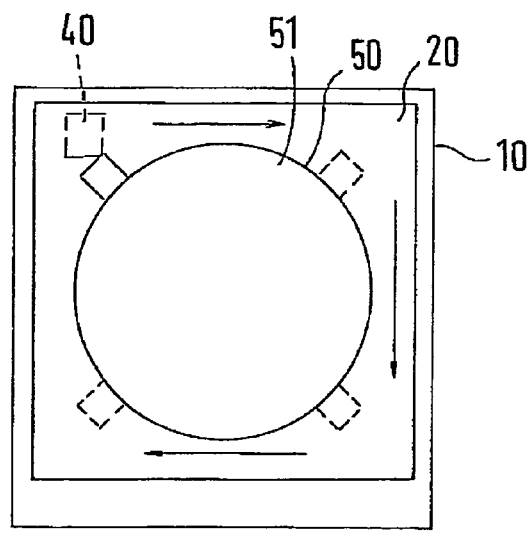
FIG. 2 shows a rear view of a fan-and-filter unit.

FIG. 1 shows a fan-and-filter unit 1 in a perspective illustration consisting of a fan housing 10 having a fan unit 50 with fan motor 51 installed therein (cp. FIG. 2), a filter mat arrangement 20 and a fan cover 30 and further comprising a filter mat monitoring unit 40.

Fan housing 10 possess, on its front side facing to fan cover 30, a large, for example rectangular or square, opening which is surrounded by a continuous rectangular or square, respectively, frame and tapers rearwardly like a funnel with wall sections adjoining the frame and thus comprises a frustoconical shape, wherein a parallel rear side facing away from the front side is closed by a wall section. A round opening is provided in the rear side wall section of filter housing 10 which is surrounded by a cylindrical section protruding rearwards which accommodates the fan motor and a fan wheel driven thereby. Fan unit 50 is provided with a protective grid on its front side and advantageously also on its rear side.

Presently, filter mat arrangement 20 is comprised of two filter mats, namely a standard filter mat (A) and a fine filter mat (B) and covers completely the front opening of fan housing 10. Alternatively, filter mat arrangement 20 may comprise only one or more than two filter mats. Further, embodiments of the filter mat arrangement 20 with more or less porous mat structure, membrane-like mat structure, e.g. for shielding humidity in damp rooms and/or with electromagnetic shielding effect may be used which may be inserted as additional filter mats and wherein a filter mat may possess one or more of these characteristics. For example, electrically conducting components, such as conductive particles or conductive threads may be introduced into the filter mat, so that a corresponding electrical conductance or resistance, respectively, is associated therewith. Filter mat arrangement 20 may also be embodied more or less porous or permeable to air, respectively, thereby having a corresponding flow resistance for air flow which, however, should be as low as possible combined with filter characteristics as good as possible. Filter mat arrangement 20 is attached to the front opening of the frame surrounding fan housing 10, e.g. with the aid of fan cover 30, wherein it is previously fixed to the rear side of fan cover 30 by means of a holding device, e.g. in form of a grill-like holding grid at fan cover 30.

Fan cover 30 is formed as a louvre grill having horizontal lamellae with downwardly sloping top side and air passage gaps (which are not visible in FIG. 1) arranged therebehind or therebetween, wherein the lamellae form, with respect to the front side in cross-section, a sawtooth-shaped structure. Fan cover 30 is placed onto the front frame of fan housing 10 with its centre approximately in an imaginary extension of the rotor axis of fan unit 50 and is fixed, in particular snapped on, wherein, in a lower corner region, e.g. a biased lock finger, releasable by means of a tool, engages in an attached station of fan cover 30 into a mating locking receptacle of fan housing 10 in region of the front frame. Further, filter mat monitoring unit 40 with an illuminated display visible from the exterior is received within fan cover 30, for example in an upper corner region.

FIG. 2 shows fan-and-filter unit 1 with fan unit 50 and fan motor 51 inserted into fan housing 10 from the rear side, while also in a transparent illustration of the rear side fan housing wall (assumed, not really present) filter mat arrangement 20 as well as filter mat monitoring unit 40 are visible.

Figure 3:
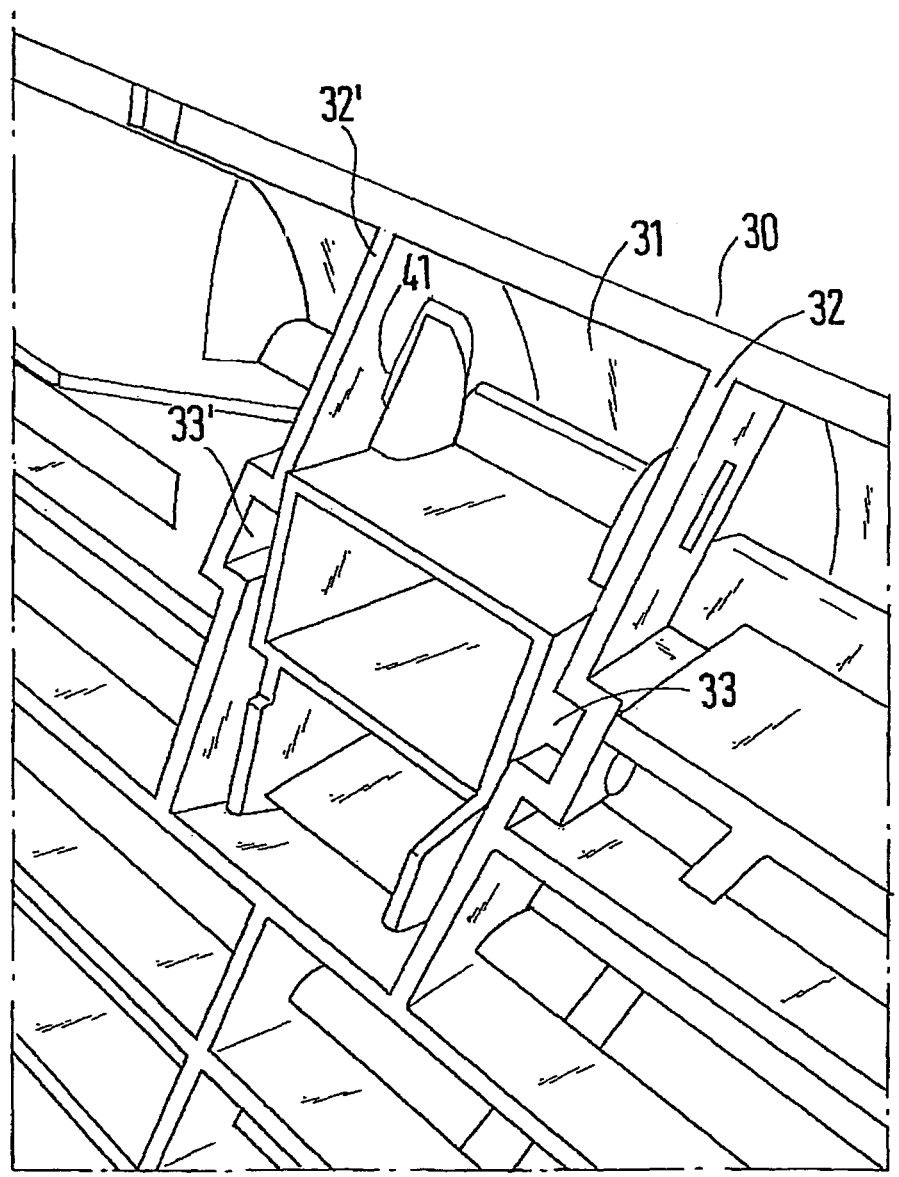
FIG. 3 shows a section of the fan-and-filter unit in the region of a fan cover from a rear side thereof.

FIG. 3 shows a section of fan cover 30 from a rear side thereof. In the region of the upper (or alternatively lower) edge of fan cover 30 in which lamellae and gap-shaped passing openings for air are present, a recess 31 is formed to the rear side of fan cover 30 which comprises two wall-like boundaries 32 parallel and perpendicularly to the lamellae vertically to the plane of the fan cover 30 and rounded, at its upper rim, by a horizontal edge of fan cover 30 and at its lower rim by a horizontal lamella wall. Guiding grooves 33, 33' are formed within the boundaries 32, approximately in its middle region, which extend recess 31 outwardly vertical to the plane of the fan cover 30. As a whole, recess 31 forms a rectangular-like cavity which is merely rounded a little bit at its upper edge region and receives an insert 41 of filter mat monitoring unit 40, wherein lateral guiding posts 43 of insert 41 engage into guiding grooves 33, 33', as clarified in FIG. 4.

Figure 4:
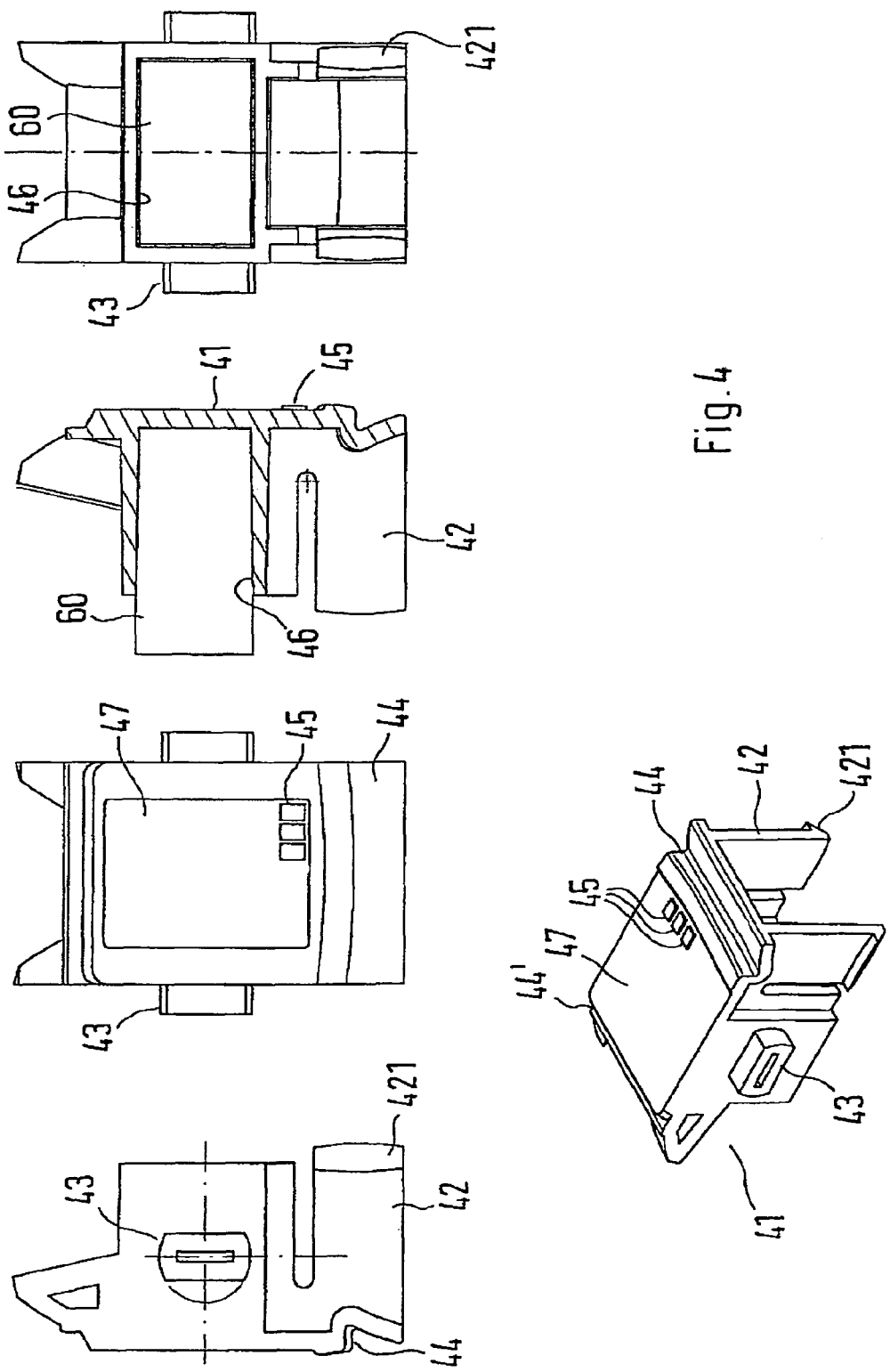
FIG. 4 shows different views of an insert of the fan-and-filter unit.

FIG. 4 shows an exemplary embodiment for insert 41 in a perspective illustration (bottom part) and (top part from the left to the right hand side) in a view from the right hand side, in a top view to a top side 47, in a cross-sectional illustration from the left hand side and from the bottom. Insert 41 is symmetrical with respect to a vertical center longitudinal plane except an arrangement of illuminated displays 45 or receiving openings thereof, respectively. From a top side 47 which faces in an installed state of insert 41 to the front side of filter-and-fan unit 1 laterally moulded wall sections and resilient snap-lock fingers 42 with locking tabs 421 extend perpendicularly rearwards. Guiding posts 43 which protrude outwardly are formed to the wall sections. Cover side 47 is bounded by fitting sections 44 (somewhat rounded in the example) which are transverse with respect to the two wall sections, wherein snap-lock fingers 42 are moulded to a section adjoining cover side 47 which is offset rearwardly and which is, with its free edge away from the fitting section 44, oriented to the front side, i.e. forms an angle of less than 90° with respect to the plane of the cover side 47. Three receiving openings for illuminated display 45 which are neighboring in transverse direction are formed in cover side 47 or the wall of insert 41, to include e.g. three light emitting diodes for differently coloured light (preferably red, yellow, green). Alternatively, e.g. only one receiving opening for an illuminated display, in particular light emitting diode, may be provided which may emit merely light of one colour or light of several colours for signalling depending on the control thereof. Further, a receptacle 46 for receiving components of filter mat monitoring unit 40, such as e.g. one or more sensor elements, an electrical energy supply and/or electronic circuit components is arranged in the insert 41, as in particular shown in the illustration on the upper right hand side. Receptacle 46 is open on its rear side facing away from cover side 47 and is bounded by cover side 47 or the walls thereof on its front side, by side wall sections laterally and by transverse wall sections between side wall sections and thus forms a rectangular cavity open to the rear side.

Figure 5:
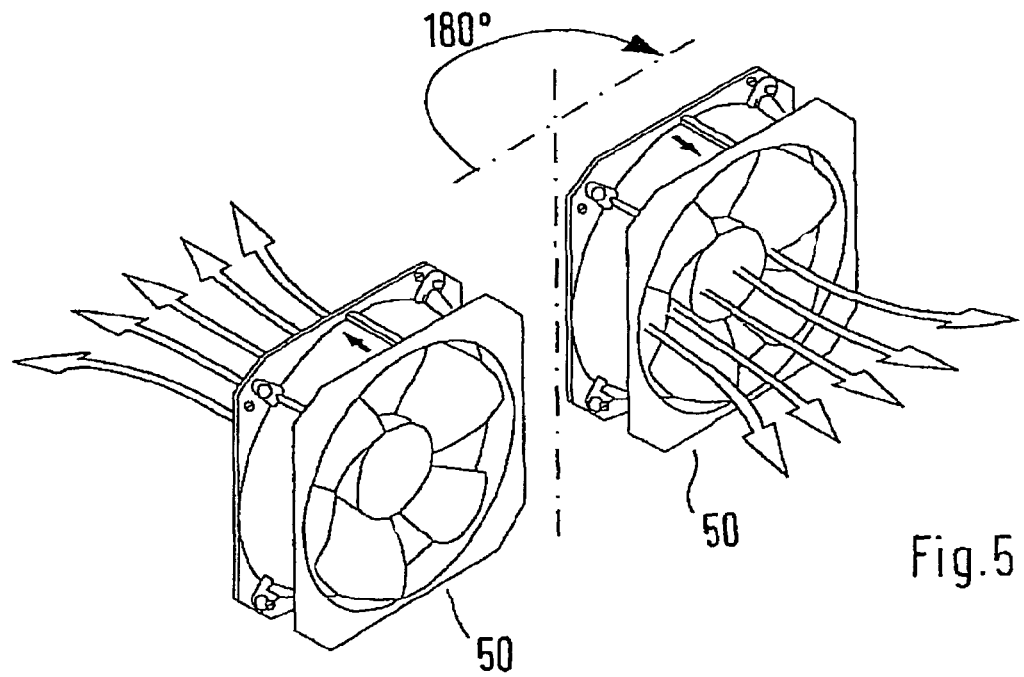
FIG. 5 shows a fan unit of the fan-and-filter unit with two different flow directions of sucked and exhausted air.

As shown in FIG. 5, fan units 50 may be driven by a corresponding control of fan motor 51 alternatively for sucking or exhausting air. If now the fan-and-filter unit is installed in the wall of a switchgear cabinet or housing, air for cooling may be sucked through the louvre grill of fan cover 30 into the switchgear cabinet or hot air may be exhausted therefrom. For installing the fan-and-filter unit, a cut-out is made in the wall of the switchgear cabinet or housing, respectively, adapted to the frame around the opening of fan housing 10, so that the frame abuts to the wall like a flange with a continuous rim section, as shown in references DE 198 60 433 B4 and DE 93 06 032 U1 mentioned in the introductory, incorporated by reference. For exchanging filter mats, fan-and-filter unit 1 remains installed at the switchgear cabinet or housing, respectively, with its fan housing 10 and fan unit 50 accommodated therein, and only fan cover 30 is removed. Since filter mat monitoring unit 40 with insert 41 and relevant components is mounted within the fan cover, a separate mounting at the switchgear cabinet or housing thereof with illuminated display 45 is unnecessary, wherein mounting of the illuminated display 45 within fan cover 30, in particular within insert 41, is well recognizable for the user or the service staff from the outside of the switchgear cabinet or housing, in particular when a filter mat exchange is signalled by illuminated display 45.

Figure 6:
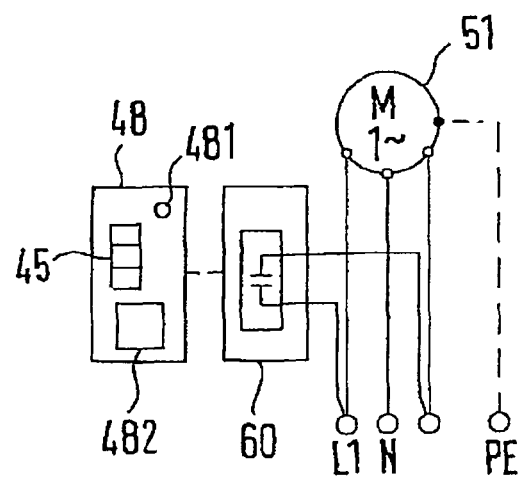
FIG. 6 shows a schematic illustration of a filter mat monitoring unit and a fan motor connected to a fan control.

For exchanging filter mat arrangement 20, it is regularly sufficient to remove fan cover 30 with a small distance from the frame of fan housing 10, e.g. to drop it down. To this end, flexible connection wires of filter mat monitoring unit 40 may remain connected to the fan-and-filter unit 50 or a control unit thereof, respectively, or even to further control means of the switchgear cabinet or housing, wherein the length of the connecting wires must be chosen adequately. Alternatively, connecting means which are easy to detach may be present for connecting wires of the filter mat monitoring unit 40, or filter mat monitoring unit 40 may even, without any connecting wires to fan unit 50 or switchgear cabinet or housing, respectively, completely be integrated into the fan cover 30 wirelessly. To this end, monitoring components 48, sensor elements 481, an electrical energy supply and/or a monitoring electronics 482 with corresponding electronic circuit components, as shown in FIG. 6, are partly or completely accommodated by insert 41.

Filter mat monitoring unit 40 comprises e.g. a timer means for determining the service life of filter mat arrangement 20 and/or a soiling sensor means comprising at least one sensor element 481 and monitoring electronics 482 in which signals output by the timer means and/or the soiling sensor means can be processed and analyzed by means of a processing means and at least one drive signal for the illuminated display 45 can be produced. If the illuminated display is embodied e.g. as light emitting diode display, it will consume very little electrical energy, so that even the electrical energy supply may be miniaturized and accommodated in very confined spaces. As sensors, e.g. flow sensors, pressure sensors, temperature sensors, optical sensors based on reflection or based on transmission, electrical field sensors, such as capacitive sensors, magnetic field sensors, electrical conductivity sensors or resistance sensors, respectively, or a combination of at least two of those sensors, may be considered, wherein the sensors in turn may comprise one or more sensor elements, such as the optical sensor a light emitting and a light receiving element or the conductivity sensor two spaced apart electrodes to be contacted with the filter mat arrangement. Such sensors may also be used for the timer means for forming a detection unit by which the operation condition of fan unit 50 is detected to measure an operating time of fan unit 50 and to aggregate operating periods, so that the service life or the service state of fan unit 50 may be detected even without a wired connection to a fan controller 60. Alternatively, a wired connection of filter mat monitoring unit 40 to fan controller 60, e.g. for tapping a current signal or a voltage for determining the operation of fan unit 50 may be provided.

By means of said sensors, not only the operation time of fan unit 50 may be measured, but, in a more sophisticated embodiment of the monitoring electronics 482, also the operation condition of the fan unit, e.g. whether it is often driven in a high load operation or mostly with low power. Such information retrieved from monitoring electronics 482 may then additionally be considered in the monitoring electronics 482 for evaluating the state of filter mat arrangement 20 and be used for signalling a filter mat exchange via illuminated display 45.

In a simplest case, a fixed maintenance interval may be predefined by means of the timer means, and illuminated display 45 may be driven for signalling the filter mat exchange when the time interval expires. Alternatively or additionally, the degree of soiling of filter mat arrangement 20 may be detected by means of the soiling sensor means and, when a predetermined degree of soiling (threshold) is exceeded, a signal for filter mat exchange is output via illuminated display 45. Additionally, the signals from the timer means and from the soiling sensor means may be analyzed in combination. An advantageous embodiment of filter mat monitoring unit 40 consists in that a service person may set different set values for operating conditions of the switchgear cabinet or housing, for example in an environment with high air pollution and humidity or low air pollution or low humidity. Thereby, input means and associated monitoring electronics 482 of filter mat monitoring unit 40 may be configured such that an operation period or a degree of soiling for filter mat exchange may also be directly predefined.

If filter mat monitoring unit 40 is equipped with a programmable integrated circuit, such as a microcontroller, different monitoring scenarios may be programmed and predefined in this way to control the illuminated display dependent thereon.

The invention claimed is:

1. A fan-and-filter unit to be mounted in the wall off a switch cabinet or housing, comprising a fan unit inserted in a fan housing, a filter mat arrangement mounted upstream of the fan unit and a fan cover immobilizing the filter mat, wherein
the fan-and-filter unit has a filter mat monitoring unit which is designed to detect the service life and/or a degree of soiling of the filter mat arrangement and which comprises an insert integrated into the fan cover and having an illuminated display visible from the exterior of the fan cover facing away from the fan unit and being designed to display at least exceeding of a predetermined or predeterminable service life and/or a predetermined or predeterminable degree of soiling, wherein a recess adapted to the insert is formed in the cover in which the insert is accommodated, and
the filter mat monitoring unit comprises a timer for determining the service life of the filter mat arrangement and/or a soiling sensor having at least one sensor element for determining the degree of soiling of the filter mat arrangement and a monitoring electronics to analyze signals output by the timer and/or the soiling sensor and to produce at least one drive signal for the illuminated display, and
wherein the insert comprises at least one receiving chamber for an electric power supply unit, for the timer, for the monitoring electronics and/or for at least one sensor element and that the insert is attached to the fan cover from inside or outside, wherein either all components of the filter mat monitoring unit except at least one sensor element and/or an external electric power supply or all components of the filter mat monitoring unit including their electric power supply are received by the insert.

2. The fan-and-filter unit of claim 1, wherein different set values for operating conditions of the switch cabinet or housing or directly service lives or degrees of soiling for exchanging the filter mat arrangement may be input to the monitoring electronics.

3. The fan-and-filter unit of claim 1, wherein the illuminated display includes a light emitting diode arrangement to emit light of at least two different colors.

4. The fan-and-filter unit of claim 2, wherein the timer comprises an operation timekeeper for fan operation.

5. The fan-and-filter unit of claim 1, wherein the timer and/or the soiling sensor comprises a detector means for detecting the operating time and/or the operating conditions of the fan unit which is coupled to the fan unit through a wired or wireless connection for signal detection and which supplies detection signals to the timer, the operating time and/or the operating state of the fan unit since the last filter exchange being determined on basis of those detection signals.

6. The fan-and-filter unit of claim 1, wherein the soiling sensor includes a flow sensor, a pressure sensor, a temperature sensor, an optical sensor, an electric field sensor, a magnetic field sensor or an electric conductivity sensor or a combination of at least two of such sensors, wherein the sensors comprise one or more sensor elements.

7. The fan-and-filter unit of claim 1, wherein the recess is arranged in the region of a grid structure with air outlet openings of the fan cover.

8. The fan-and-filter unit of claim 1, wherein the insert is detachably snapped in or screwed to the fan cover.

* * * * *